United States Patent
Cheng et al.

(10) Patent No.: US 8,901,619 B2
(45) Date of Patent: Dec. 2, 2014

(54) ASYMMETRIC FINFET DEVICES

(75) Inventors: Kangguo Cheng, Guilderland, NY (US); Bruce B. Doris, Slingerlands, NY (US); Ying Zhang, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 373 days.

(21) Appl. No.: 13/470,393

(22) Filed: May 14, 2012

(65) Prior Publication Data

US 2012/0223386 A1  Sep. 6, 2012

Related U.S. Application Data

(62) Division of application No. 12/881,152, filed on Sep. 13, 2010, now Pat. No. 8,263,446.

(51) Int. Cl.

| H01L 27/148 | (2006.01) |
| H01L 21/263 | (2006.01) |
| H01L 29/78 | (2006.01) |
| H01L 29/66 | (2006.01) |
| H01L 21/265 | (2006.01) |
| H01L 29/51 | (2006.01) |

(52) U.S. Cl.
CPC ..... *H01L 29/66795* (2013.01); *H01L 21/26506* (2013.01); *H01L 21/2633* (2013.01); *H01L 21/26586* (2013.01); *H01L 29/517* (2013.01); *H01L 29/785* (2013.01)

USPC ............................ 257/241; 438/156; 438/164

(58) Field of Classification Search
CPC ........................ H01L 29/785; H01L 29/66795
USPC ......... 257/241, 353, 401, 328, 329, 618, 623, 257/E29.052, E29.022, E29.275; 438/149, 438/157, 164, 156, 283

See application file for complete search history.

(56) References Cited

U.S. PATENT DOCUMENTS

| 6,842,048 B2 | 1/2005 | Krivokapic | 326/112 |
| 6,849,884 B2 | 2/2005 | Clark | 257/192 |
| 7,612,420 B2 | 11/2009 | Lenoble | 257/401 |
| 7,737,501 B2 | 6/2010 | Zhu | 257/365 |

*Primary Examiner* — David Vu

(74) *Attorney, Agent, or Firm* — Louis J. Percello; Otterstedt, Ellenbogen & Kammer, LLP

(57) ABSTRACT

Asymmetric FET devices, and a method for fabricating such asymmetric devices on a fin structure is disclosed. The fabrication method includes disposing over the fin a high-k dielectric layer followed by a threshold-modifying layer, performing an ion bombardment at a tilted angle which removes the threshold-modifying layer over one of the fin's side-surfaces. The completed FET devices will be asymmetric due to the threshold-modifying layer being present only in one of two devices on the side of the fin. In an alternate embodiment further asymmetries are introduced, again using tilted ion implantation, resulting in differing gate-conductor materials for the two FinFET devices on each side of the fin.

4 Claims, 6 Drawing Sheets

ASYMMETRIC FINFET DEVICES

CROSS REFERENCE TO A RELATED APPLICATION

This application is a Division of application Ser. No. 12/881,152, filed Sep. 13, 2010, which is incorporated herein by reference in its entirety.

BACKGROUND

The present invention relates to electronic devices of very large scale integration (VLSI) circuits. In particular, it relates to fin type non-planar FET (Field-Effect-Transistor) devices.

As FET devices are being scaled down, the technology becomes more complex, and changes in device structures and new fabrication methods are needed to maintain the expected performance improvements from one successive device generation to the next. non-planar devices offer possible avenues to continue on the path of miniaturization.

BRIEF SUMMARY

Asymmetric FET devices, and a method for fabricating such asymmetric devices on a fin structure is disclosed. The method includes disposing over the fin a high-k dielectric layer followed by a threshold-modifying layer, performing an ion bombardment at a tilted angle which removes the threshold-modifying layer over one of the fin's side-surfaces. The completed FET devices will be asymmetric due to the threshold-modifying layer being present only in one of two devices on the side of the fin. In an alternate embodiment further asymmetries are introduced, again using tilted ion implantation, resulting in differing gate-conductor materials for the two devices on each side of the fin.

BRIEF DESCRIPTION OF THE SEVERAL VIEWS OF THE DRAWINGS

These and other features of the present invention will become apparent from the accompanying detailed description and drawings, wherein.

DETAILED DESCRIPTION

Figure 1:
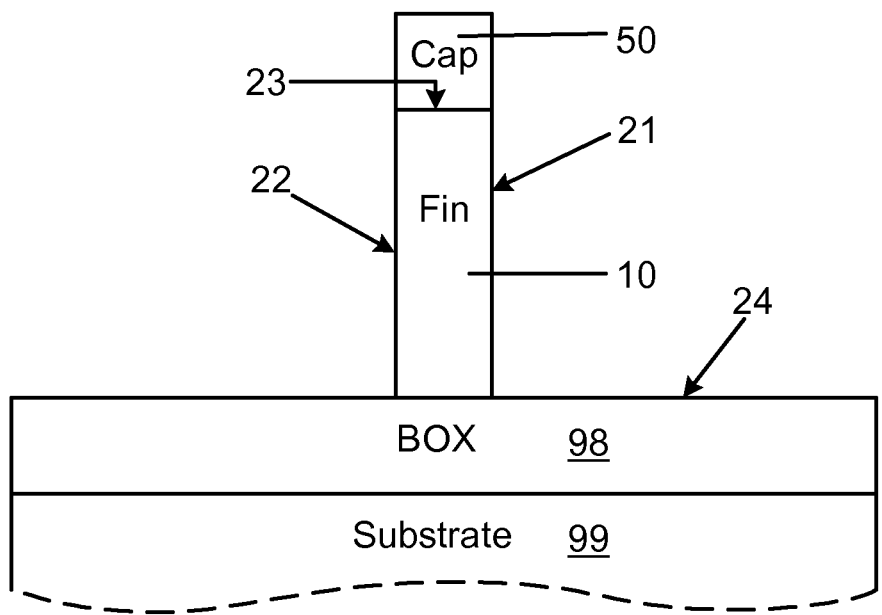
FIG. 1 schematically shows an initial stage of an embodiment of the invention.

It is understood that Field Effect Transistor-s (FET) are well known in the VLSI electronic arts. Standard components of an FET are the source, the drain, the body in-between the source and the drain, and the gate. The gate is overlaying the body and is capable to induce a conducting channel on the surface of the body between the source and the drain. In the usual nomenclature, the FET is hosted on the surface of the body. The gate is typically separated from the body surface by the gate insulator, or gate dielectric. Depending whether the "on state" current in the channel is carried by electrons or by holes, the FET comes in two types: as NFET, or PFET. (In different nomenclature the NFET and PFET devices are often referred to as NMOS and PMOS devices.)

There is a family of FET devices that have a non-planar, three dimensional geometric configuration. These devices are three dimensional because they are associated with fin structures. In fin type devices the body of the transistor is formed in a fin rising out of a planar background, typically having both vertical and horizontal surfaces. The gate of the non-planar device may engage the vertically oriented body surfaces, or sidewalls, and the top surface as well, resulting in several planes being used for transistor channel formation. In other typical non-planar devices the gate of the non-planar device may not engage the top surface only the vertically oriented body surfaces. There are further variations of non-planar devices, for instance some with multi faceted fins and multiple sidewall sections. In the nomenclature of the art, non-planar fin type devices where only the sidewall surfaces are engaged by the gate are called FinFET devices. Embodiments of the present invention deal with such FinFET devices.

As it is known in the art, non-planar FET devices with fin type bodies, have several advantages when compared to planar devices. In embodiments of the present invention, the dimensions of fin structures may be of a height of about 5 nm to 100 nm, and of a width of between about 3 nm to about 80 nm.

A typical FinFET, as fabricated and used presently in the art, has a symmetric structure, meaning that the FET devices on each side surface of the fin are essentially identical with one other, having same device characteristics. However, for some applications, it is desirable to have an asymmetric multi-gated FinFET. For instance, depending on the power supply, the characteristics of the asymmetric FinFET can be adjusted to achieve an optimal trade-off between power consumption and device performance. For example, when the FinFET is powered by a battery, low power consumption requirements usually overweigh performance requirements. On the other hand, when the FinFET is powered by an external AC supply, high performance is usually desired.

Fabricating asymmetric multi-gated FinFETs may be possible with complicated and costly methods. Such complicated and costly methods would typically require additional masking steps compared to fabricating symmetric, namely essentially identical, FET devices on both sides of a semiconductor fin. Furthermore, scaled fins are narrow, rendering overlaying masks very difficult.

It would be desirable to have asymmetric FinFET devices with improved methods for forming them, which methods would be quite similar in complexity and in cost to fabricating traditional, symmetric FinFET devices. Embodiments of the instant disclosure teach such fabrication methods and asymmetric devices. The introduced asymmetries include differing threshold modifying layers and differing gate conductors between the FET devices on opposing side surfaces of a fin.

Manufacturing of NFET, PFET, and FinFET devices, is established in the VLSI art. It is understood that there are large number of steps involved in such processing, and each step may have practically endless variations known to those skilled in the art. For embodiments of this disclosure it is understood that the whole range of known processing techniques are available for fabricating the devices, but only those process steps will be detailed that are related to the embodiments of the present invention.

FIG. 1 schematically shows an initial stage of an embodiment of the invention. First, a fin 10 is being received. The term of "received" is intended to be inclusive of any possible manner by which one may arrive at this initial stage of an embodiment. The fabrication of FinFET devices may have just reached this stage, or the fin may have been supplied by some source for the purpose to apply the fabrication methods of the embodiments of the present invention.

The material of the semiconductor fin 10 may be a Si based material, which without limitation may be essentially pure silicon (Si), but may also be a silicon-germanium (SiGe) alloy, or Si with carbon Si:C. However, other materials are not excluded, for instance III-V or II-IV semiconductors. The fin material in representative embodiments of the invention is in a single-crystalline state.

In typical embodiments of the instant invention the fin 10 is formed over the principal surface 24 of a support structure. The support structure may be a combination of a buried oxide layer (BOX) 98 on top of a semiconductor substrate 99. Such BOX 98 layers are typical in the art, but embodiments of the present invention do not depend on the BOX/substrate combination, other support structures known in the art are included, as well.

The fin 10 has two side surfaces 21, 22, a first side surface 21 opposite to a second side surface 22. These side surfaces 21, 22 are essentially perpendicular to the principal surface 24 of the support structure. The fin 10 also has a top surface 23, which is spaced away from, and is essentially parallel with, the principal surface 24 of the support structure.

A cap layer 50 is usually covering the fin top surface 23. The cap layer often may be a leftover portion of a hard mask that was used in patterning the fin. However, one may form a cap layer 50 after the fin 10 has already been fabricated. For instance, the cap layer 50 may be devised by directional deposition, such as high density plasma deposition, or directional oxidation, such as gas ion cluster beam oxidation. A timed etch-back can be performed after the directional deposition or oxidation to remove a thin film on fin side surfaces 21, 22, leaving the cap layer on the fin top surface 23.

Figure 2:
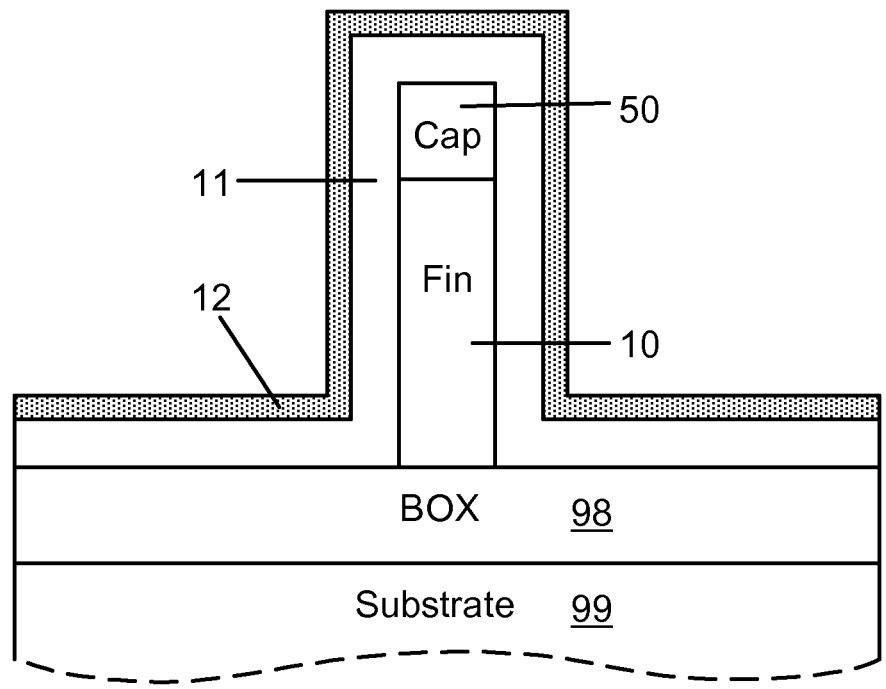
FIG. 2 shows a stage in the fabrication after layer depositions in an embodiment of the invention.

FIG. 2 shows a stage in the fabrication after layer depositions in an embodiment of the invention. As stated earlier, discussion herein includes only those steps and structures that relate to embodiments of the invention, but it is understood that in-between, before, or after, the discussed processing steps there may be many others involved that are known in art of fabrication of FET devices, and all and any of these are included within the scope of the embodiments of the invention.

FIG. 2 shows the processing after disposing over the fin a high-k dielectric layer 11 followed by a threshold-modifying layer 12. Both of these layers are known in the FET fabrication arts. In general there may be other layers deposited as well, with steps known in the art, but they are not directly related to the embodiments of the present invention. Examples of high-k dielectrics include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The threshold-modifying layer 12, may be "n"-directional such as an element selected from the combination of groups IIA and IIIB of the periodic table of the elements, for instance lanthanum. Alternatively, an "n"-directional threshold-modifying layer 12 may be an oxide of at least one element selected from the combination of groups IIA and IIIB of the periodic table of the elements, for instance lanthanum oxide.

The threshold-modifying layer 12, may also be "p"-directional such as aluminum or aluminum oxide. The high-k dielectric thickness in representative embodiments of the invention ranges from 0.5 nm to 5 nm, while thinner or thicker high-k dielectric is also conceived. The threshold-modifying layer 12 in representative embodiments of the invention is quite thin, in the range of 0.1 nm to 2 nm. The disposition of these layers in the present embodiments may not be different than in the standard practice of the art of FET fabrication. Such practice includes but it is not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LR-PCVD), ultrahigh vacuum chemical vapor deposition (UH-VCVD), metalorganic chemical vapor deposition (MOCVD), physical vapor deposition, sputtering, plating, evaporation, ion beam deposition, electron beam deposition, laser assisted deposition, chemical solution deposition, or any combination of those methods.

Figure 3:
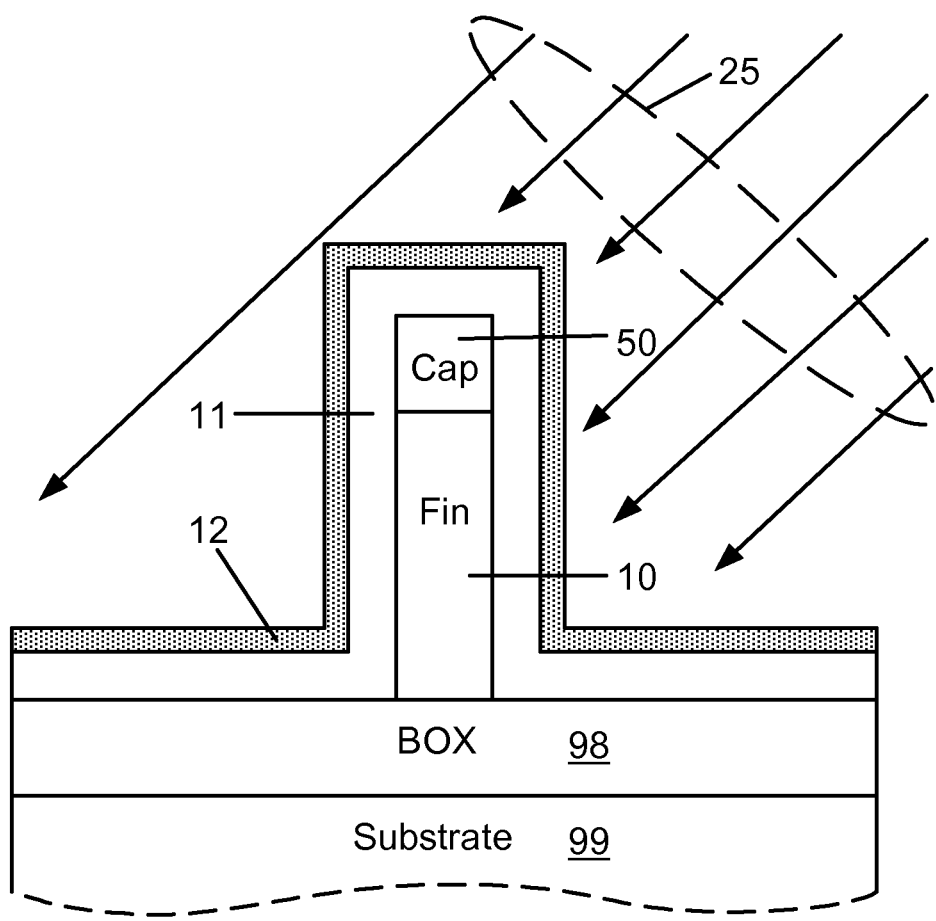
FIG. 3 symbolically shows layer removal by tilted angle ion bombardment.

FIG. 3 symbolically shows layer removal by performing a tilted angle ion bombardment 25. The threshold-modifying layer 12 over the first side surface 21 is receiving the ion bombardment, while over the second side surface 22 it is not receiving the ion bombardment due to being shadowed by the fin 10. The ion bombardment 25 removes the threshold-modifying layer 12 from over the first side surface 21. In a typical embodiment of the invention the ion bombardment species may be Xe, Ar, Ge, Si, or others, at an energy and dose depending on the bombarding species, but 5 KeV at a dose of $1E14/cm^2$ may be representative. However, other species and doses may be considered, as well.

The ion bombardment 25 is performed at a tilted angle. The customary direction of ion bombardment, or implantation, during device processing is vertical relative to the principal surface 24 of the support structure. In embodiments of the present invention, as illustrated in FIG. 3, the bombardment 25 is carried out at an angle tilted from the vertical, exposing the threshold-modifying layer 12 over the first side surface 21 to ion damage. The tilting angle may range from 15° to 75°, but it is more typically around 45° from vertical. Since the threshold-modifying layer 12 is rather thin, the ion bombardment 25 parameters can be so chosen to remove the threshold-modifying layer 12 from over the first side surface 21.

Figure 4A:
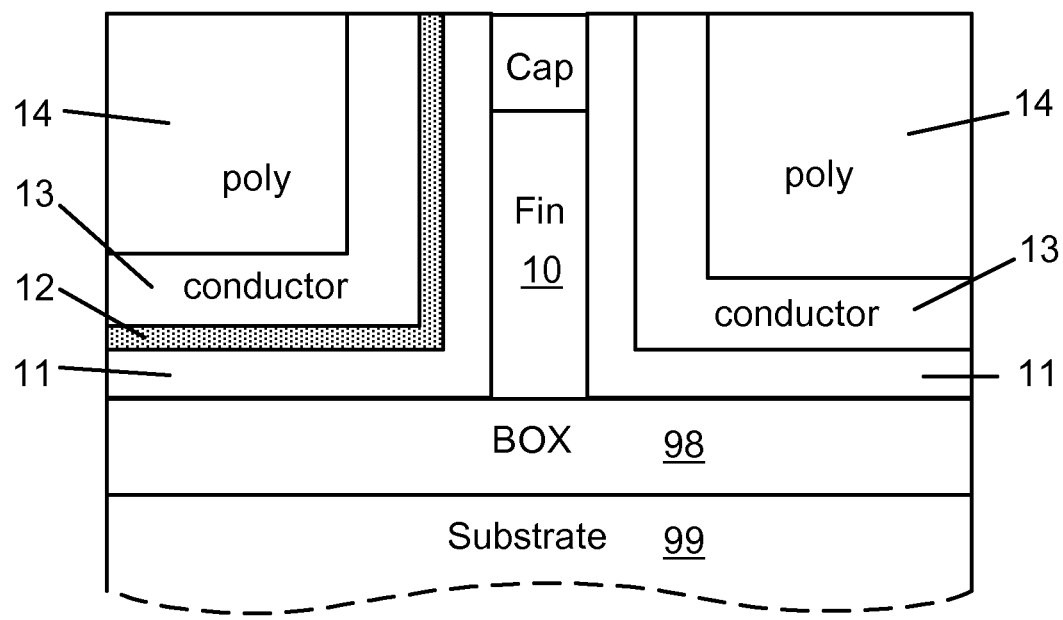
FIGS. 4A and 4B schematically show a cross sectional and a top view of a late stage in the fabrication of asymmetric FET devices.
Figure 4B:
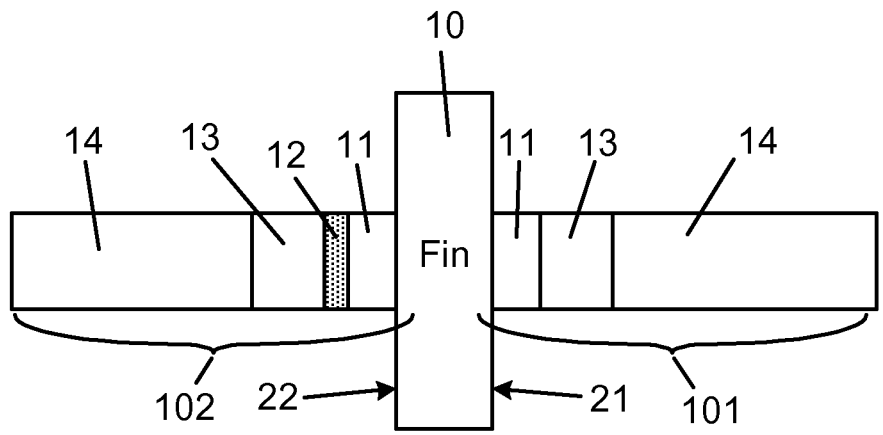

FIGS. 4A and 4B schematically show a cross sectional and a top view of a late stage in the fabrication of the asymmetric FET devices. Following the ion bombardment 25, a gate conductor layer 13 is disposed over the fin 10. FIGS. 4A and 4B show a stage when following the gate conductor layer 13 a polysilicon layer 14 has also been deposited. Furthermore, the figure shows that the fin has been planarized. The polysilicon layer 14, the gate conductor layer 13, and all other layers that may also have been deposited over the fin 10, have been planarized, using the cap layer 50 to stop the planarization. The planarization is carried out with steps known in the art, for instance, by chemical mechanical polishing (CMP).

FIGS. 4A and 4B show the arrangement of a gate conductor layer 13 with a polysilicon layer 14 as example only. Polysilicon is a preferred material in the art for completing a gate structure. However, this depiction should not limit the large number of materials and spatial arrangements that are known in the art as possibilities for disposing over the fin as gate conductive layer. There may be only one layer, or there may be multiple conductive layers over the threshold-modifying layer 12. Examples of materials known in the art that may be used for what FIGS. 4A and 4B show as the gate conductor layer 13, polysilicon layer 14 combination, include without limitation: polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition.

Using titanium nitride as the gate conductor 13 material in combination with the polysilicon layer 14 is typical in the embodiments of the invention.

With the deposition of the gate conductor layer 13 the first side surface 21 becomes adapted to host a first FET device 101 and the second side surface 22 becomes adapted to host a second FET device 102. Since the tilted angle ion bombardment 25 removed the threshold-modifying layer 12 from the first FET device 101, the two FET devices are asymmetric, due to the threshold-modifying layer 12 being present only in the second FET device 102.

In FIG. 4B the fin 10 is shown in the top view, while often even at this stage it may be covered by the cap layer 50, as shown in FIG. 4A. In FIG. 4B it is also evident that the gate structures of the two devices, 101, 102, have been patterned. It is part of the simplicity of the embodiments of the present disclosure that in spite of achieving asymmetric FET devices, the two gate structures may be patterned jointly and simultaneously, with commonly carried out processing steps. For instance, a single reactive ion etching (RIE) may be used to define the gates of both the first 101 and the second 102 FET.

In particular embodiments of the invention, the gate dielectric 11, the threshold modifying layer 12, and gate conductor layer 13, are so chosen to achieve predetermined desired properties for the completed first and second FET devices 101, 102.

In alternate embodiments of the invention additional asymmetries may be introduced between devices on differing surfaces of a FinFET, and still maintain the simplicity of the fabrication, with no need for additional masks and patterning. FIGS. 5 to 8 show views of such alternate embodiments.

Figure 5:
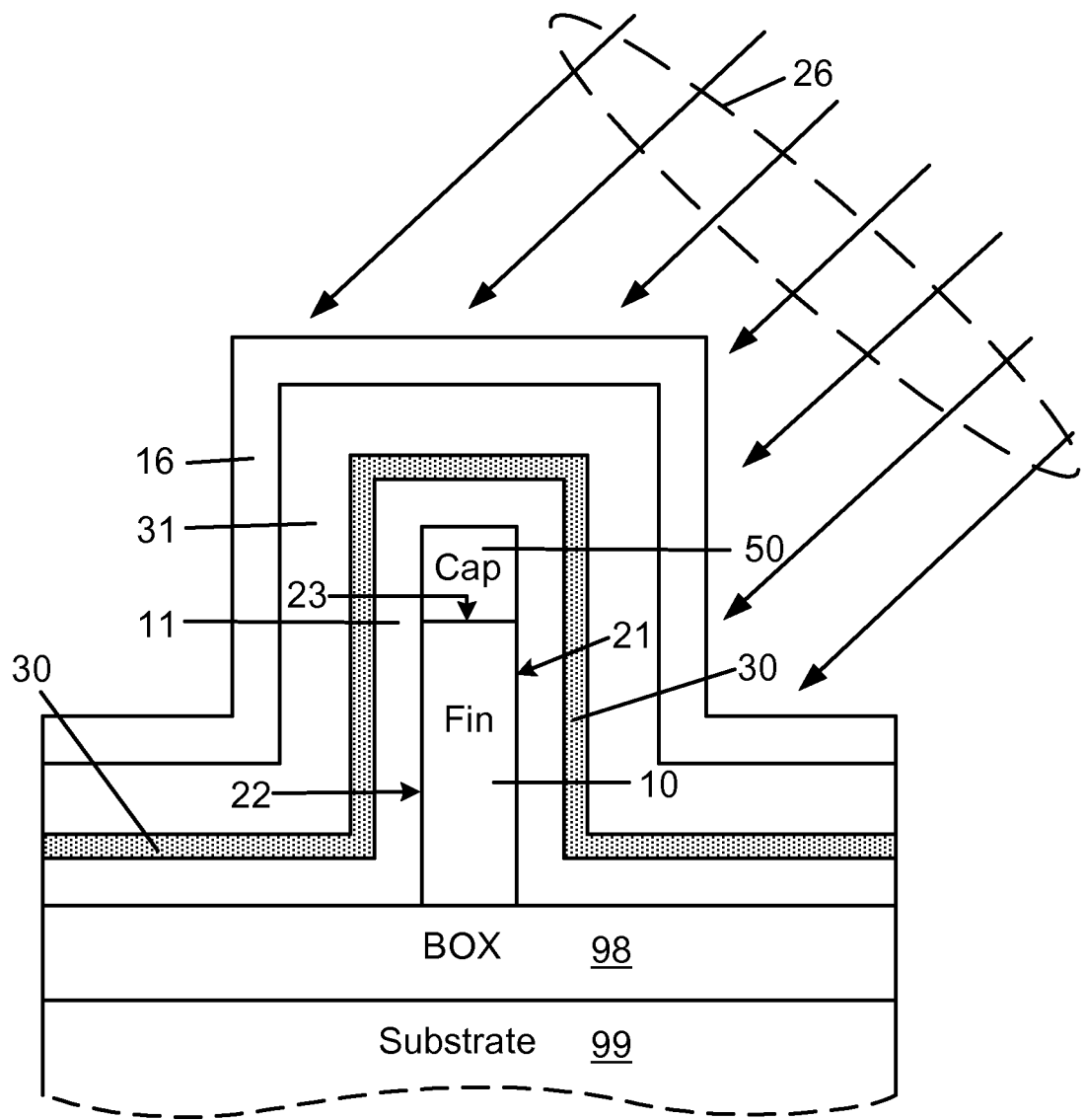
FIG. 5 schematically shows tilted angle ion implantation facilitating layer removal in an alternate embodiment of the invention.

FIG. 5 schematically shows tilted angle ion implantation facilitating layer removal in an alternate embodiment of the invention. The initial stage for alternate embodiments is the same as shown and discussed in relation to FIG. 1, and it will not be repeated here. Next, in progressing toward the fabrication stage shown in FIG. 5, an ordered sequence of layers is disposed over the fin 10. This ordered sequence includes a high-k dielectric layer 11, a first gate conductor layer 31, and an undoped semiconductor front layer 16. The thicknesses of these layers may be between 3 nm and 50 nm.

The semiconductor front layer 16 is needed to perform a function, which requires form the semiconductor front layer 16 to have etch selectivity between its undoped and doped state. Typically the semiconductor front layer 16 would be selected to be amorphous silicon, but it may be other, for instance, without limitation: polysilicon or polycrystalline SiGe. In the following, for simplicity, the semiconductor front layer 16 may be referred to as amorphous silicon, but with the understanding that it may be a different material having the same functionality for the purposes of the embodiments of the present disclosure.

Similarly as discussed in relation to FIG. 3, the disposition of the layers in the present embodiments may not be different than in the standard practice of the art of FET fabrication. And the specific known materials for these layers are the same ones as discussed in relation to FIGS. 2 to 4.

One may optionally also dispose a first threshold-modifying layer 30 in-between the high-k dielectric layer 11 and the first gate conductor layer 31. In general there may be other layers deposited as well, with steps known in the art, but they are not directly related to the embodiments of the present invention.

Figure 6:
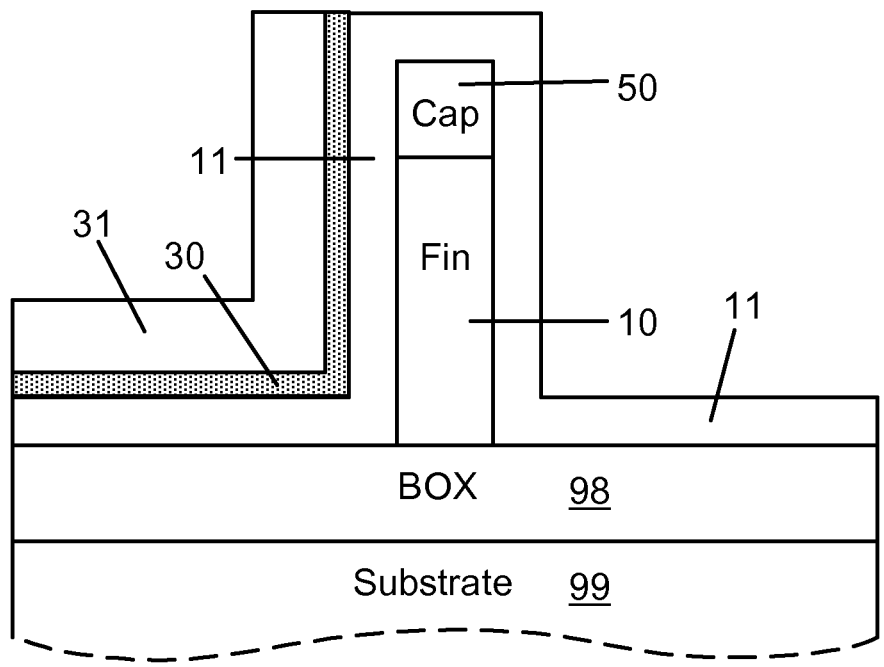
FIG. 6 shows a stage in the fabrication after layer removals in an alternate embodiment of the invention.

Following this sequence of depositions, an ion implantation 26 is performed at a tilted angle. The customary direction of ion implantation during device processing is vertical relative to the principal surface 24 of the support structure. In embodiments of the present invention, as illustrated in FIG. 6, the implantation 26 is carried out at an angle tilted from the vertical. The tilting angle may range from 15° to 75°, but it is more typically around 45° from vertical. The amorphous Si layer 16 over the first side surface 21 is receiving the ion implantation 26, and it is not receiving the implantation over the second surface 22 due to being shadowed by the fin 10. The implanted species may be a Si dopant know in the art, for instance arsenic, antimony, or others. Consequently, the amorphous Si layer acquires a doped portion over the first side surface. As it is know in the art doped amorphous Si may be selectively etched relative to undoped amorphous Si, for instance with aqueous etchant containing ammonia.

Having removed the doped portion of the amorphous Si layer, the first gate conductor layer 31 becomes exposed over the first side surface 21, and it is being removed by a wet selective etch known in the art. For instance if the first gate conductor layer 31 is titanium nitride it can be removed by SC1 etch. Many other such combinations are known in the art. If an optional first threshold-modifying layer 30 has also been deposited, it may be removed together with the first gate conductor layer 31. Next, the remaining portion of the amorphous Si layer 16 is being etched away. FIG. 6 shows this stage in the fabrication after the removals of the discussed layers in an alternate embodiment of the invention.

Figure 7:
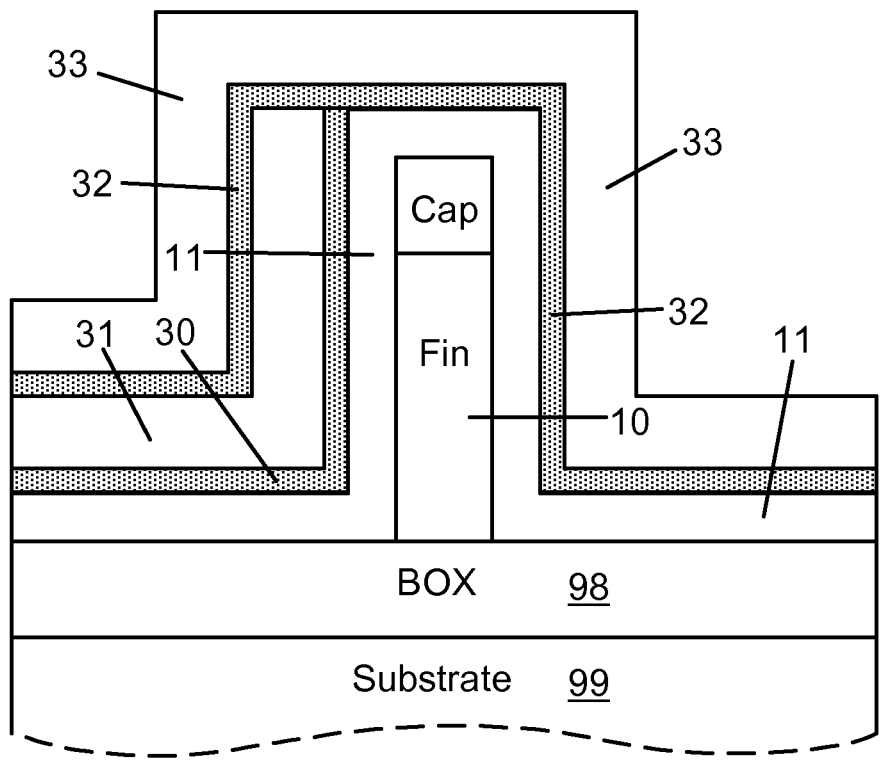
FIG. 7 shows building asymmetry into gates of FET devices in an alternate embodiment of the invention.

After the stage shown in FIG. 6, a second gate conductor layer 33 is disposed over the fin. Having a gate dielectric 11 already over both side surfaces, and now having a first gate conductor layer 31 and a second gate conductor layer 33 in place, the first side surface 21 becomes adapted to host a first FET device 101, and the second side surface 22 becomes adapted to host a second FET device 102. Due to the fact that the gate conductor layers of the two devices differ, the first and the second FET devices are asymmetric. FIG. 7 shows building such an asymmetry into gates of FET devices in a typical alternate embodiment of the invention.

FIG. 7 further shows asymmetry due to the presence of the optional first 30 and second 32 threshold-modifying layers. If the first threshold-modifying layer 30 has been disposed, and it is present over the second side surface 22, the asymmetry between the two devices is further due to the first threshold-modifying layer 30 being present only in the second FET device 102. If a second threshold-modifying layer 32 has also been disposed, the asymmetry is further due to the second threshold-modifying layer 32 being active only in the first FET device 101. The way the FETs are fabricated, the second threshold-modifying layer 32 is also present in the second FET device 102. However, the second threshold-modifying layer 32 being in differing locations in the first 101 and the second 102 FET device. In the second FET device 102 the second threshold-modifying layer 32 may be between the first 31 and second 33 gate conductor layers, and in such a location it is not active, having no effect on the threshold of the second FET device 102.

Figure 8A:
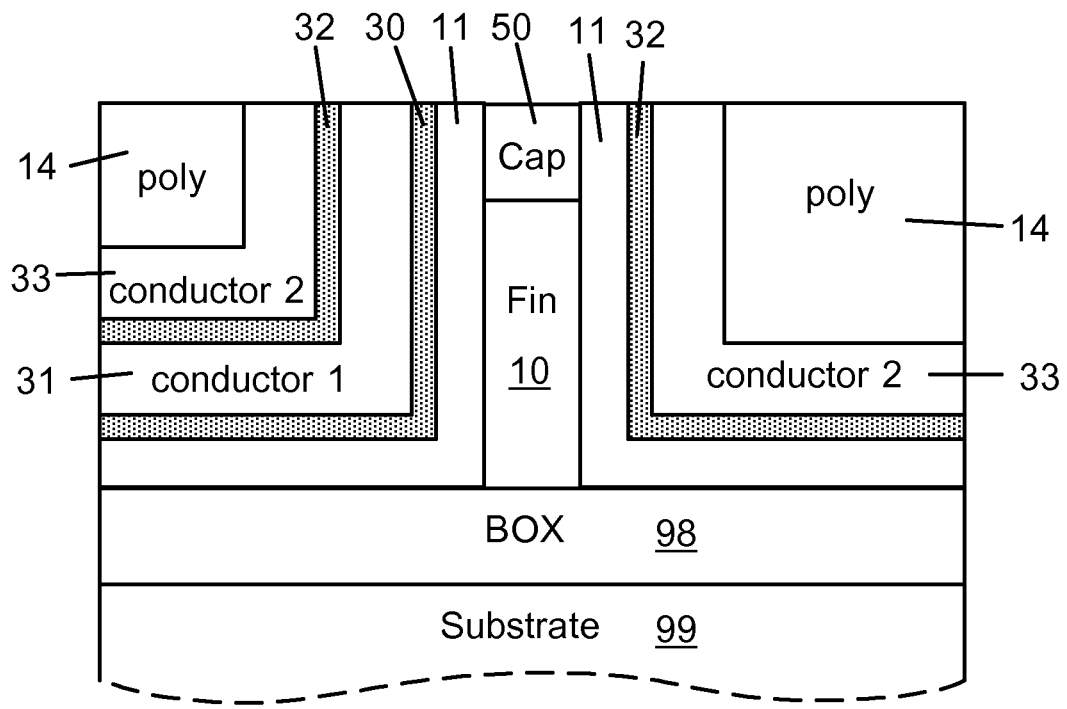
FIGS. 8A and 8B schematically show a cross sectional and a top view of a late stage in the fabrication of asymmetric FET devices in an alternate embodiment of the invention.
Figure 8B:
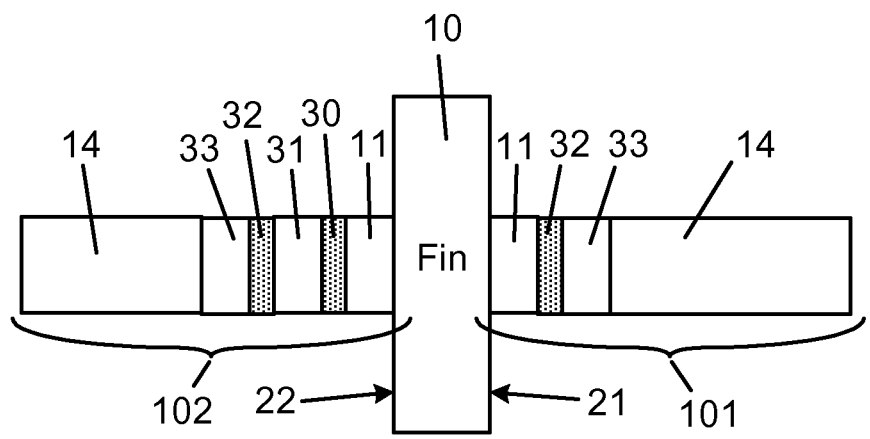

FIGS. 8A and 8B, schematically show a cross sectional and a top view of a late stage in the fabrication of asymmetric FET devices in an alternate embodiment of the invention. At this stage, following the second conductor layer 33, a polysilicon layer 14 has also been deposited. Similarly as discussed in relation to FIG. 4, FIGS. 8A and 8B show the arrangement of gate conductor layers 31, 33 with a polysilicon layer 14 as example only. Polysilicon is a preferred material in the art for completing a gate structure. However, this depiction should not limit the large number of materials and spatial arrangements that are known in the art as possibilities for disposing over the fin a gate conductive layer. There may be only one layer, or there may be multiple conductive layers. The material choices for what FIG. 8 simply shows as the conductor layers 31, 33, and polysilicon 14 combination, are similar to those discussed in relation to FIG. 4.

FIG. 8B also shows that the fin has been planarized. The polysilicon layer 14, the second gate conductor layer 33, and all other layers that may also have been deposited over the fin, have been planarized, using the cap layer 50 to stop the planarization. The planarization is carried out with steps known in the art, for instance, by chemical mechanical polishing (CMP).

In the in the top view of FIG. 8B the fin 10 is shown, while often even at this stage the fin may be covered by the cap layer 50, as shown in FIG. 8A. In FIG. 8B it is also evident that the gate structures of the two devices, 101, 102, have been patterned. The simplicity of the embodiments of the present disclosure is further manifested in that, in spite of achieving asymmetric FET devices, the two gate structures may be patterned jointly and simultaneously, in commonly carried out processing steps. For instance, a single reactive ion etching (RIE) may be used to define the gates of both the first 101 and the second 102 FET.

The selection of materials for alternate embodiments of the invention is similar to the ones used in embodiments shown in FIGS. 1 to 4. For instance, the first 31 and second 33 gate conductor layers may both be different phases of titanium nitride, or they may be completely different conductors, or alloys, such as titanium nitride and tantalum nitride. Such electronic materials, for instance high-k dielectrics, gate conductor layers, threshold modifying layers, are known in the art as discussed in relation to the gate conductor in FIG. 4, and any an all are included in the embodiments of the invention. Thicknesses of the various layers are also similar in various embodiments of the invention.

In particular alternate embodiments of the invention, the gate dielectric 11, the first and second threshold modifying layers 30, 32, the first and second conductor layers 31, 33 are so chosen to achieve predetermined desired properties for the completed first and second FET devices 101, 102.

After the depictions of FIGS. 4 and 8, the FET fabrications would follow known method of the VLSI art, until the full completion of the devices and circuits.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

The invention claimed is:

1. Field Effect Transistor (FET) devices, comprising:
a fin of a semiconductor material, wherein said fin has a first side surface opposite a second side surface;
a first FET device hosted on said first side surface and a second FET device hosted on said second side surface, wherein said first FET device and said second FET device comprise gate insulators and gates, wherein said gate insulators comprise a same high-k dielectric, and said gates comprise a same gate conductor;
a threshold-modifying layer over said high-k dielectric of said second FET device; and
wherein said first and said second FET device are FinFET devices having an asymmetry due to said threshold-modifying layer being absent in said first FET device.

2. Field Effect Transistor (FET) devices, comprising:
a fin of a semiconductor material, wherein said fin has a first side surface opposite a second side surface;
a first FET device hosted on said first side surface and a second FET device hosted on said second side surface, wherein said first FET device and said second FET device comprise gate insulators and gates, wherein said gate insulators comprise a same high-k dielectric, and said gates comprise differing gate conductors; and
wherein said first and said second FET device are FinFET devices manifesting an asymmetry due to said gates comprising said differing gate conductors.

3. The FET devices of claim 2, further comprising a first threshold-modifying layer over said high-k dielectric of said second FET device, wherein said first and said second FET device further manifesting said asymmetry due to said first threshold-modifying layer being absent in said first FET device.

4. The FET devices of claim 2, further comprising a second threshold-modifying layer over said high-k dielectric of said first FET device, wherein said first and said second FET device further manifesting said asymmetry due to said second threshold-modifying layer being in differing locations in said first and said second FET device.

\* \* \* \* \*